United States Patent [19]

Kunugi et al.

[11] Patent Number: 4,739,513
[45] Date of Patent: Apr. 19, 1988

[54] METHOD AND APPARATUS FOR MEASURING AND CORRECTING ACOUSTIC CHARACTERISTIC IN SOUND FIELD

[75] Inventors: Yoshiro Kunugi; Shinichi Suzuki; Masayuki Kato; Akio Tokumo; Toshikazu Yoshimi; Takeshi Sato, all of Saitama, Japan

[73] Assignee: Pioneer Electronic Corporation, Tokyo, Japan

[21] Appl. No.: 739,654

[22] Filed: May 31, 1985

[30] Foreign Application Priority Data

May 31, 1984 [JP] Japan .................. 59-111835
Oct. 31, 1984 [JP] Japan .................. 59-229991
Oct. 31, 1984 [JP] Japan .................. 59-229992

[51] Int. Cl.⁴ .................. H03G 5/00; H04R 5/027
[52] U.S. Cl. .................. 381/103; 381/96; 381/26
[58] Field of Search .................. 381/1, 103, 98, 26, 381/59, 96

[56] References Cited

U.S. PATENT DOCUMENTS

| | | | |
|---|---|---|---|
| 4,060,696 | 11/1977 | Iwahara et al. | 381/26 |
| 4,340,780 | 7/1982 | Odlen | 381/103 |
| 4,388,494 | 6/1983 | Schöme et al. | 381/26 |
| 4,421,949 | 12/1983 | Eberbach | 381/98 |
| 4,458,362 | 7/1984 | Berkovitz et al. | 381/103 |

FOREIGN PATENT DOCUMENTS

| | | | |
|---|---|---|---|
| 0050100 | 4/1982 | European Pat. Off. | 381/26 |
| 2068678 | 8/1981 | United Kingdom | 381/103 |

*Primary Examiner*—Forester W. Isen

[57] ABSTRACT

The acoustic transmission characteristics of a sound field, such as in the passenger compartment of a vehicle, are measured by placing microphones at the positions of ears of a dummy mannequin having a sound absorbing characteristic similar to that of a clothed adult human. The transmission characteristics are then corrected, such as with an automatic graphic equalizer, to provide optimized listening conditions inside the sound field for an actual listener. The use of the invention results in a listener's perception of completely natural sound.

3 Claims, 9 Drawing Sheets

METHOD AND APPARATUS FOR MEASURING AND CORRECTING ACOUSTIC CHARACTERISTIC IN SOUND FIELD

BACKGROUND OF THE INVENTION

The present invention relates to a method for measuring an acoustic transmission characteristic between sound sources and a predetermined listening point such as inside a vehicle.

In order to measure the acoustic transmission characteristic in a given sound field, heretofore a method has generally been employed whereby a dummy head on the ears of which microphones are arranged is set at the listening point, and the characteristic is determined from the outputs of the microphones.

However, this measuring method is disadvantages in that when a real person is present in the sound field, the sound field is disturbed by the sound absorption of the person's clothes and body, and this effect cannot be measured. Especially in the case of a restricted sound field such as that inside a vehicle, the sound field characteristic when no person is present in the sound field is greatly different from the sound field characteristic provided when a person is present. Moreover, with this method, it is rather difficult to integrally evaluate a sound field including a plurality of sound sources. Also, integrated measurement results including various effects of the ears, such as directionality and the addition effect, cannot be obtained using this method.

Moreover, since the dummy head has a directional pattern which changes intricately with frequency and the dummy head is comparable in size with the wavelengths of the audio frequency sounds, and the dummy head has both right and left ears, it is difficult to accurately evaluate a sound field according to the conventional method in a case where the sound sources are sequentially driven.

The invention further relates to automatic graphic equalizers, and more particularly to an automatic graphic equalizer in which a test signal is used to measure a frequency characteristic in a sound field, and the test result is utilized to automatically control the graphic equalizer.

A conventional device of this type is constructed as shown in FIG. 1. In FIG. 1, right and left channel audio signals together with a "pink" noise signal from a pink noise generating source 3-8 are applied to a signal applying and selecting switch 3-1. The two audio signals are subjected to frequency characteristic control by a graphic equalizer 3-2, and then applied through amplifiers 3-3R and 3-3L to loudspeakers 3-4R and 3-4L, respectively, thus producing sound radiated inside a vehicle, for instance.

The sound thus radiated is received by a microphone 3-5, and the output signal of the microphone 3-5 is applied to a frequency characteristic measuring section 3-6 where the signal is divided into frequency bands. Level detection is carried out for every band, as a result of which d.c. data values corresponding to the signal powers in the various bands are obtained. These data values are converted into digital data, which is sequentially stored in a controller 3-7, implemented with a microcomputer. The band characteristics of the graphic equalizer 3-2 are automatically controlled according to the digital data thus stored.

FIG. 2 shows an example of the frequency characteristic measuring section 3-6. The output signal from the microphone is applied through a microphone amplifier 3-9 to a frequency-band dividing BPF (bandpass filter) 3-10. The outputs of the BPF 3-10 are converted into d.c. signals by a rectifying circuit 3-11 and a smoothing circuit 3-12. One of the d.c. signals at a time is selected by a switch 3-13 and applied to an A/D (analog-to-digital) converter 3-14.

It is assumed that the above-described circuit provides a frequency characteristic as shown in FIG. 3A. In this case, the graphic equalizer 3-2 is adjusted so that the sound field frequency characteristic is flat, whereupon data values $D_1$, $D_2$, ... and $D_n$ ($n=5$ in FIG. 3A) are obtained. For this purpose, the graphic equalizer 3-2 should be adjusted so as to have a characteristic as shown in FIG. 3B.

In order to obtain adjustment data values $G_n$ ($n=1$ through 5) as shown in FIG. 3B, the following calculations are carried out by the controller 3-7.

$$D_{av} = \sum_{n=1}^{5} D_n/5,$$

$D_n = D_n - D_{av}$, and
$G_n = -\Delta D_n$ ($n=1$ through 5).

The frequency characteristic in the sound field is made substantially flat by controlling the graphic equalizer 3-2 with the adjustment data $G_n$. Under this condition, the application of the pink noise is suspended and the switch 3-1 is operated to apply the audio signals. However, instead of this method, the application of the pink noise may be continued, the frequency characteristic measurement carried out again, and according to the measurement result, adjustment performed again. In order to take maximum advantage of the dynamic range of the A/D converter, the microphone amplifier 3-9 is designed so that the amplifier gain is controlled by the controller 3-7. However, it may be replaced by an amplifier having an ALC (automatic level control) function.

In the above-described conventional device, the measuring microphone 3-5 is built into the system, and the number of microphones is limited to only a single one. Therefore, the device often suffers from the difficulty that the frequency characteristic at the listening point does not coincide with that at the position of the microphone. In the case where the measurement is carried out with one microphone set at the listening point, the acoustic waves travel along paths 3-41 and 3-42 to reach the microphone, as shown in FIG. 4A. However, since the person listens to the sound with both ears and there are paths 3-43 and 3-44 in FIG. 4B in addition to the aforementioned paths 3-41 and 3-42, the person hears the sounds as the sum of these waves. Accordingly, the frequency characteristic measured with only one microphone does not match well with the actual hearing frequency characteristics.

Still further, the invention relates to an automatic sound field correcting system for automatically correcting a frequency characteristic in a listening space as desired.

An example of a conventional automatic sound field correcting system is shown in FIG. 5. In this system, an audio signal outputted by a signal source 4-1 such as a tape deck is supplied to one input of an adder 4-2, to the other input of which the output of a test signal generator 4-3 is connected. The test signal generator 4-3 generates a test signal, such as a "pink" noise signal, having a known characteristic. The output terminal of the adder 4-2 is connected to a graphic equalizer 4-4 having a plurality of adjustment bands. The output terminal of the graphic equalizer 4-4 is the output terminal of the system. The output terminal is connected to a power amplifier 4-5 in an acoustic reproduction device. The power amplifier 4-5 drives a loudspeaker 4-6.

Sound ratified from the loudspeaker 4-6 is detected by a microphone 4-7, the output terminal of which is connected to a frequency characteristic detecting circuit 4-8. The circuit 4-8 has a plurality of BPFs (band-pass filters) having different passbands for detecting the frequency characteristic in the sound field according to the output signal of the microphone 4-7. The frequency characteristic detecting circuit 4-8 is connected through an A/D (analog-to-digital) converter 4-9 to a control circuit 4-10 The control circuit 4-10, implemented with a microcomputer, controls the operation of the test signal generator 4-3 and the gain levels of the adjustment bands of the graphic equalizer 4-4.

In this circuit, in response to an automatic sound field correcting instruction from a keyboard (not shown) or the like, the control circuit 4-10 causes the test signal generator 4-3 to operate. As a result, the test signal is applied through the adder 4-2 to the graphic equalizer 4-4. In this operation, the application of the audio signal to the adder 4-2 from the signal source 4-1 is suspended, and the output frequency characteristic of the graphic equalizer is made flat with the gain levels of the adjustment bands being made equal. The test signal outputted by the graphic equalizer is applied through the power amplifier 4-5 to the loudspeaker 4-6, as a result of which sound corresponding to the test signal is radiated in the listening space from the loudspeaker 4-6. At the listening point, the microphone 4-7 detects the sound pressure of the test signal reproduced sound to provide a sound pressure signal, which is supplied to the frequency characteristic detecting circuit 4-8. The circuit 3-8 detects the sound pressure signal level according to the adjustment bands of the graphic equalizer 4-4, and the resultant detection levels are converted into digital data by the A/D converter 4-9. The digital data is applied to the control circuit 4-10. The control circuit 4-10 detects the frequency characteristic of the detected sound pressure signal, i.e., the frequency characteristic in the sound field according to the digital data, controls the gain levels of the adjustment bands of the graphic equalizer 4-4 so that the frequency characteristic in the sound field becomes flat, and then stops the operation of the test signal generator 4-3. Thus, automatic sound field correcting operation has been accomplished.

In general, when a person listens to reproduced sound in a listening space, the effects of the head, the face, the ears, etc. cannot be neglected. However, if the listening space, the signal source, and the power amplifier, the loudspeaker, etc., have no element which may disturb the sound field frequency characteristic, it can be assumed that the sound field frequency characteristic is relatively flat. On the other hand, it is obvious that it is better to perform sound field correction under the practical condition that a person is present in the listening space. When automatic sound field correction is carried out in an ideal listening space in the same manner with the microphones of the microphone unit 4-7 set at the inlets of the external auditory canals as shown in FIG. 6, the sound field correction is affected by the head, the faces, the ears, etc. As a result, the sound field frequency characteristic obtained from the output signal of the frequency characteristic detecting circuit is different from that which is obtained in the case where a single microphone is used, for instance, the resultant frequency characteristic may not be flat, being irregular especially in the high frequency range, as indicated by the solid line a in FIG. 7. If the graphic equalizer 4-4 is adjusted so that its frequency characteristic is opposite to the frequency characteristic indicated by the solid line a, theoretically the sound field frequency characteristic is made flat. However, this method suffers from the problem that the sound produced according to the method produces a slightly unnatural auditory sensation.

Yet moreover, the invention relates to acoustic characteristic measuring device for measuring the acoustic characteristic between a plurality of sound sources provided in correspondence to a plurality of channel signals and a listening point at which a person listens to reproduced sounds from these sound sources.

A conventional acoustic characteristic measuring device of this type is as shown in FIG. 8.

As shown in FIG. 8, a pair of loudspeakers 5-1R and 5-1L are provided at the right and left sides in a room A. A signal outputted by a signal generator 5-2 is applied through a changeover switch 5-3 to the loudspeaker 5-1R or 5-1L. The changeover switch 5-3 is operated so that the signal is applied through a transmission characteristic correcting device 5-4L such as a graphic equalizer and an amplifier 5-5L to the left loudspeaker 5-1L, or it is applied through a transmission characteristic correcting device 5-4R and an amplifier 5-4R to the right loudspeaker 5-1R. The signal outputted by the signal generator 5-2 may be a pink noise signal, impulse signal, white noise signal, warble tone signal, or sine wave signal.

In order to measure the transfer function at the sound field formed by sound reproduced by the loudspeakers 5-1R and 5-1L, or in order to electrically correct the sound field characteristic according to the measurement results, a nondirectional microphone 5-6 is set at a certain point (such as a listening point where a person listens to sound from the loudspeakers 5-1R and 5-1L) in the sound field. The output of the microphone 5-6 is displayed on a display unit 5-7 to measure the sound pressure versus frequency characteristic.

A stereo acoustic reproduction system of more than one channel uses more than one loudspeaker, and there are generally available two acoustic characteristic measuring methods. In one of the methods, the measurement is carried out by applying the same phase signal to more than one signal source, and in the other method, the measurement is performed for each of the signal sources. In the former method, signals from the loudspeakers are subjected to vector addition at the position of the microphone, and the result of the vector addition is outputted as a sound pressure signal received by the microphone. In the latter method, the signals are outputted as separate sound pressure signals which the microphone receives from the two separate loudspeakers.

In the above-described conventional device, a single-point measurement is carried out in which only one microphone is installed in the sound field in which no person is present. However, of course there is a person present in an actual sound field. When a person is present in the sound field, the sound field is disturbed by the person's body. Moreover, the directional pattern of human ears can differ greatly from person to person.

Therefore, it is difficult to perform measurements which yield optimum listening conditions for all persons. In the case of stereo reproduction, it is difficult to measure a synthetic characteristic. Furthermore, in the case where, as in a mobile acoustic device, the listening point is symmetric in position, it is considerably difficult generally to evaluate the sound field with two transfer functions in the paths from the loudspeakers to the listening point converted into one.

SUMMARY OF THE INVENTION

In view of the foregoing, an object of the invention is to provide a method of measuring an acoustic characteristic inside a vehicle which can accurately evaluate the sound field inside the vehicle.

A specific feature of a method of the invention resides in that a dummy mannequin similar to structure to a real human body and which has surface sound absorbing characteristics substantially equal to the average sound absorbing characteristics of a clothed human body is set at the listening point, microphones are set at the ears of the dummy mannequin, and the outputs of the microphones are utilized to measure the acoustic transmission characteristic of the sound field.

Another feature of the acoustic characteristic measuring method according to the invention resides in that random or quasi-random noise signals not correlated with one another and a plurality of channels are employed as source signals for driving a plurality of sound sources, a received sound output characteristic at a listening point is obtained according to the average of the sum of output signals of microphones set at the ears of a dummy head positioned at the listening point, and an acoustic transmission characteristic between the listening point and the sound sources is measured according to the difference between the received sound output characteristic and a transmission characteristic before the sound sources are driven.

Another object of the invention is to provide an automatic graphic equalizer in which the frequency characteristic in a sound field is detected by receiving a test signal through two microphones set at respective ear positions, thereby to obtain a characteristic in conformance to the actual hearing sensation.

In accordance with this object, another feature of the invention resides in an automatic graphic equalizer which comprises: means for applying a test signal to first and second channel audio signal lines; graphic equalizer means provided in the audio signal lines, the graphic equalizer means having an adjustable frequency characteristic; first and second loudspeakers for radiating channel outputs of the graphic equalizer means in a predetermined sound field; a microphone unit for detecting sound in the sound field; and control means for controlling the frequency characteristic of the graphic equalizer according to the level of a detection signal provided by the microphone unit, the microphone unit comprising first and second microphones which are set at the ear positions of a person in the predetermined sound field.

A still further object of the invention is to provide an automatic sound field correcting system which, with microphones set at the ears of a listener, corrects the frequency characteristic in a sound field so that the listener will perceive the sound as natural.

Fulfilling this object, a specific feature of an automatic sound field correcting system of the invention resides in that the system comprises compensating means provided in a line through which a test signal is supplied to an electro-acoustic transducer means such as a loudspeaker to compensate the sound field frequency characteristic for loss of naturalness in hearing sensation.

Another object of the invention is to eliminate the above-described difficulties accompanying a conventional acoustic characteristic measuring system. More specifically, an object of the invention is to provide an acoustic characteristic measuring system which can accurately evaluate a sound field in agreement with the auditory perception of an actual person.

A feature of an acoustic characteristic measuring system according to this aspect of the invention resides in that, in a stereo acoustic reproduction system including a plurality of sound sources provided in correspondence to a plurality of channel signals, a measuring system is provided which has microphones set at the ears of a real human body, dummy mannequin, or dummy head located at a listening point where reproduced sound from the sound sources are listened to, and the outputs of the microphones is utilized to measure an acoustic characteristic between the listening point and the sound sources.

DESCRIPTION OF THE PREFERRED EMBODIMENTS

Preferred embodiments of the invention will be described with reference to the accompanying drawings.

Figure 9:
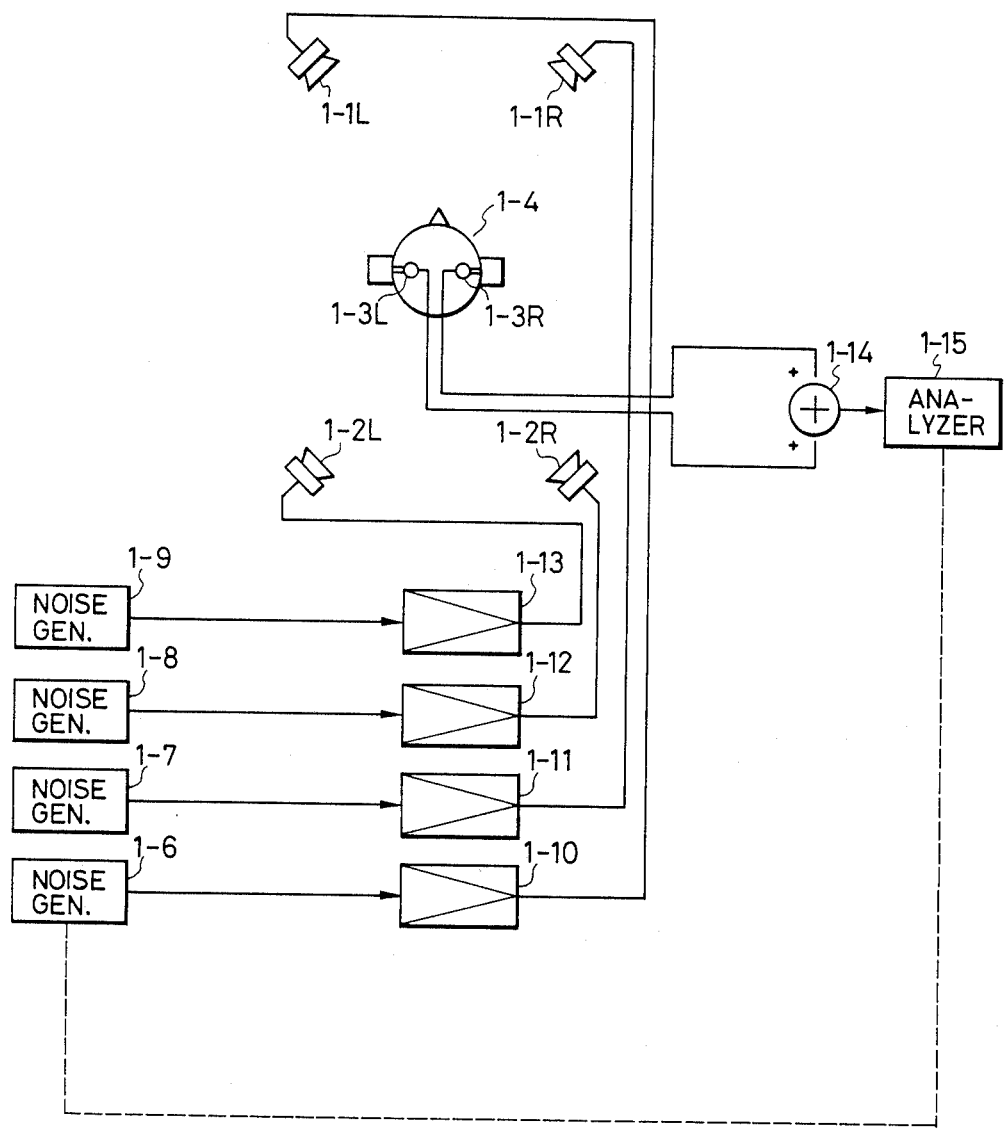
FIG. 9 is a block diagram showing a preferred embodiment of an acoustic characteristic measuring system of the invention.
Figure 10:
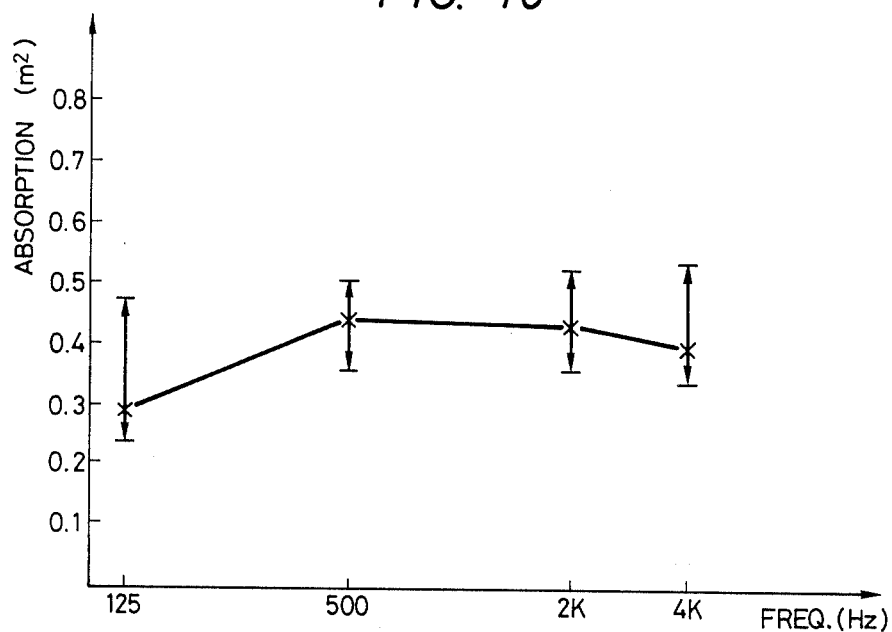
FIG. 10 is a diagram showing a sound absorbing characteristic of a clothed adult human.

As shown in FIG. 9, a pair of loudspeakers 1-1R and 1-1L are arranged as sound sources on the right and left sides of the front region inside a vehicle, and a pair of loudspeakers 1-2R and 1-2L are arranged as sound sources on the right and left sides of the rear region inside the vehicle. A dummy mannequin 1-4 (only the head of which is shown) is set at a listening point where sound reproduced by these four-channel loudspeakers can be heard. Microphones 1-3R and 1-3 L are placed at the ears of the dummy mannequin 1-4. The dummy mannequin 1-4 is similar in structure to a human body, having a trunk, legs, etc. The dummy mannequin is designed so that the sound absorbing characteristic of its surface is substantially equal to the average sound absorbing characteristic of a clothed human body. FIG. 10 indicates the sound absorbing characteristic of a clothed adult human body, obtained according to a method based on a reverberation method. The sound absorbing characteristic depends on the type of clothes worn, and therefore it may vary as indicated by an arrow in FIG. 10. By dressing the dummy mannequin similarly to a real human body, the dummy mannequin can be made to have a sound absorbing characteristic substantially equal to that of a clothed real human body.

In order to individually drive the four-channel loudspeakers 1-1L, 1-1R, 1-2L and 1-2R, noise generators 1-6 through 1-9 are provided. Random noise signals (or quasi-random noise signals) such as white noise signals generated by the noise generators 1-6 through 1-9 are amplified by amplifiers 1-10 to 1-13 and applied as source signals to the loudspeakers 1-1L, 1-1R, 1-2L and 1-2R, respectively. As the random noise signals of the various random noise generators are not correlated with one another, even if all the loudspeakers in the sound field are operated simultaneously, the sound pressure versus frequency characteristic is not made irregular by the distance differences between the microphones 1-3L and 1-3R and the loudspeakers 1-1L, 1-1R, 1-2L and 1-2R. Therefore, plural sound sources can be collectively evaluated by this method.

The output signals of the microphones 1-3L and 1-3R at the ears of the dummy head 1-4 are subjected to addition by an adder 1-14, the sum output of which is applied to an analyzer 1-15. A received sound output characteristic at the listening point is then obtained by averaging the output of the adder, and the acoustic transmission characteristic between the listening point (the dummy head) and the sound sources (the loudspeakers) is measured from the difference between the received sound output characteristic and the transmission characteristic provided before the sound sources are driven.

As described above, the dummy mannequin 1-4 is used, and the received sound output characteristic measured according to the average sum of the output signals of the microphones 1-3L and 1-3R at the ears of the dummy head, as a result of which the sound field can be expressed by a single transmission function. If the right and left channels have greatly different characteristics, a binaural effect occurs, and therefore the above evaluation may be somewhat insufficient in the sense of direction, etc. However, since a characteristic difference of the order of 3 to 6 dB in a narrow frequency range will not so greatly affect the overall evaluation, if the right and left ears are not greatly different in characteristic from each other, the evaluation using the average sum of the output signals of the microphones 1-3L and 1-3R is effective.

As is apparent from the above description, according to this embodiment of the invention, a dummy mannequin similar in structure to a real human body and having a surface sound absorbing characteristic substantially equal to the average sound absorbing characteristic of a clothed human body is set at the listening point, and the acoustic transmission characteristic is measured according to the outputs of the microphones set at the ears of the dummy mannequin. Therefore, the measurement can be achieved under the same conditions as those in the case where an actual person is present in the sound field. Accordingly, even in a small sound field such as that inside a vehicle, the acoustic characteristic in the sound field can be evaluated with high accuracy. Moreover, random noise (or quasi-random noise) signals not correlated with one another are employed as source signals for driving the plurality of sound source, which makes it possible to drive all the sound sources in the sound field simultaneously. Accordingly, the acoustic characteristic in a sound field including a plurality of sound sources can be generally evaluated. Furthermore, since the characteristic is measured according to the sum of the output signals of the microphones at the ears of the dummy head, the measurement result is a composite one including the directivity of the ears and the summing effect.

Figure 1:
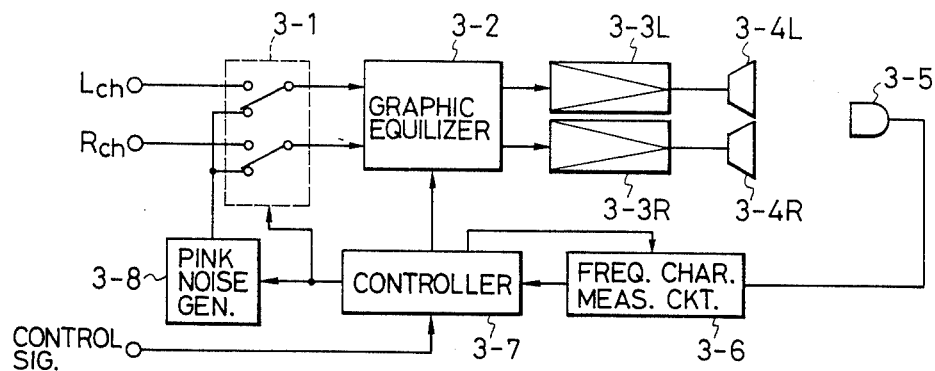
FIGS. 1 and 2 are block diagrams of conventional automatic graphic equalizers.
Figure 2:
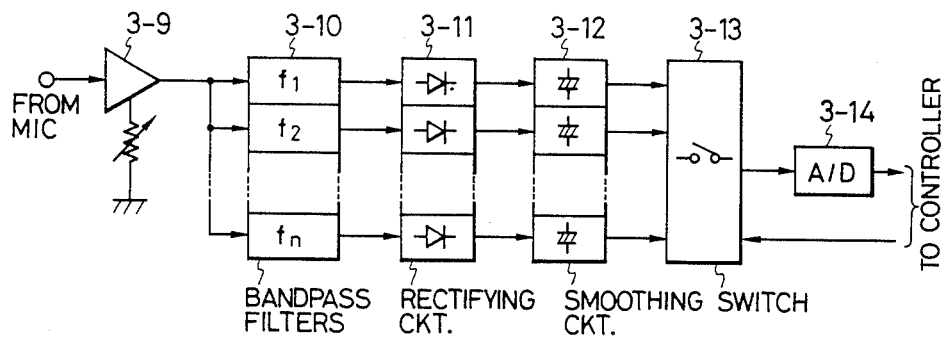
Figure 3A:
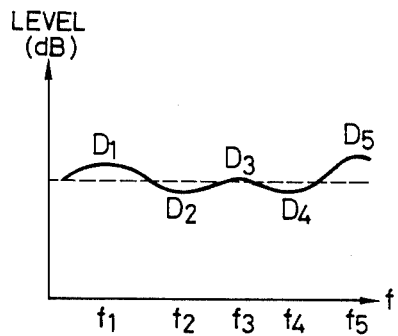
FIGS. 3A and 3B are diagrams showing characteristics of the devices of FIGS. 1 and 2.
Figure 3B:
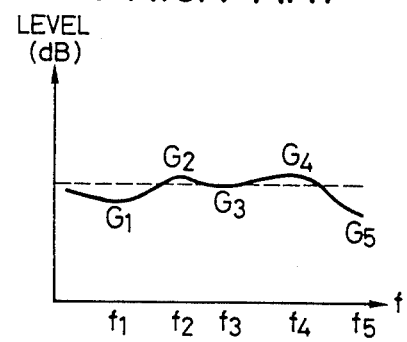
Figure 4A:
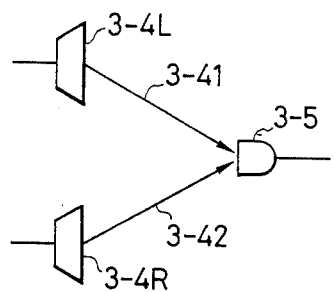
FIGS. 4A and 4B are illustrative diagrams used to described drawbacks accompanying the conventional devices of FIGS. 1 and 2.
Figure 4B:
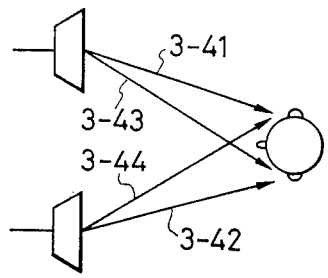
Figure 11:
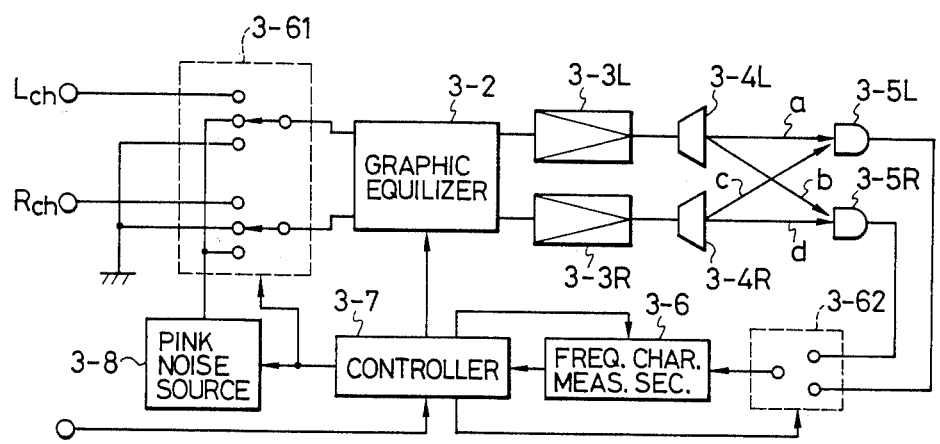
FIG. 11 is a block diagram showing an automatic graphic equalizer of the invention.

FIG. 11 is a block diagram showing a preferred embodiment of an automatic graphic equalizer of the invention. In FIG. 11, components corresponding functionally to those already described with reference to FIG. 1 are designated by corresponding reference numerals. In FIG. 11, reference numeral 3-61 designates a switch for selectively applying the right and left channel audio signals or a pink noise signal (without the audio signals) to the graphic equalizer 3-2. When the pink noise is applied to the left channel, the right channel signal line is grounded, and when the pink noise is applied to the right channel, the left channel signal line is grounded.

Figure 12:
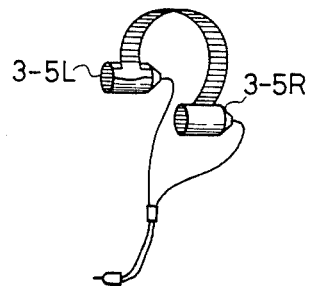
FIG. 12 is an explanatory diagram depicting a microphone unit which can be employed with the device shown in FIG. 11.

Further in FIG. 11, 3-5L and 3-5R designate two microphones set at the ears of a listener. The microphones may be designed as shown in FIG. 12, for instance. The output detection signals of the microphones 3-5L and 3-5R are selectively applied to the frequency characteristic measuring section through a switch 3-62. The other circuit arrangement is the same as in FIG. 1.

I measuring the frequency characteristic in a sound field, the controller 3-7 operates to turn on the pink noise generating source 3-8, to make the characteristic of the graphic equalizer 3-2 flat, and to cause the switch 3-61 to apply the pink noise signal to the left channel signal line. In this operation, no signal is applied to the right channel signal line. Next, the controller 3-7 causes the switch 3-62 to select the output of the microphone 3-5L, and, as in the case of the conventional device, stores the data corresponding to the signal powers in the various frequency bands. Thus, the data of the path a in FIG. 11 is obtained. It is assumed that the data values for the frequency bands $f_1, f_2, \ldots$ and $f_n$ are represented by $D_{f1-a}, D_{f2-a}, \ldots$ and $D_{fn-a}$, respectively.

Next, the switch 3-62 is operated to select the output of the microphone 3-5R, and data is stored in the same manner. As a result, the data for the path b is obtained. It is assumed that these data values are represented by $D_{f1-b}, D_{f2-b} \ldots$ and $D_{fn-b}$. The switch 3-61 is then controlled to apply the pink noise signal to the right channel signal line only. Under this condition, the switch 3-61 is operated to obtain the data value $D_{fn-c}$ and $D_{fn-d}$ ($n=1, 2, 4, \ldots n$) for the paths c and d from the outputs of the microphones 3-5L and 3-5R, respectively. Thus, the power conversion data for the paths a through d between the ears of the listener and the right and left channel microphones 3-5R and 3-5L are obtained.

Since the listener perceives the sound as the sum of the acoustic outputs of the loudspeakers and the sound waves in the respective paths, the controller 3-7 determines a frequency characteristic in the listening points by using values obtained by adding the data of the paths.

That is, $$D_{f1} = D_{f1-a} + D_{f1-b} + D_{f1-c} + D_{f1-d}$$

$$D_{f2} = D_{f2-a} + D_{f2-b} + D_{f2-c} + D_{f2-d}$$

$$D_{fn} = D_{fn-a} + D_{fn-b} + D_{fn-c} + D_{fn-d}$$

Thus, the data values $D_{fn}$ for each frequency band are obtained. If, with respect to the conventional device, $D_n$ is replaced by $D_{fn}$, then the remaining operations are the same as in the conventional device.

Figure 13:
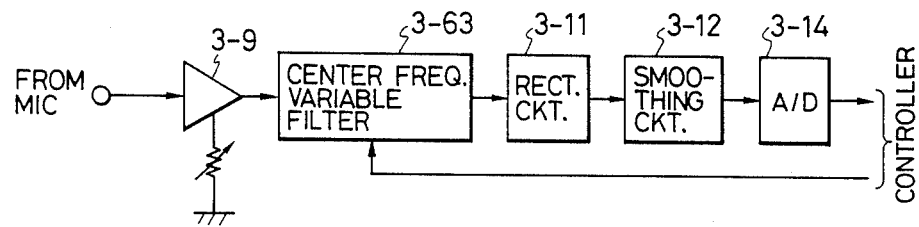
FIGS. 13 through 16 are block diagrams of automatic graphic equalizers of the invention.

In the above-described embodiment, a number of BPFs having different center frequencies are provided in the frequency characteristic measuring section 3-6. However, they may be replaced by a filter whose center frequency is changed stepwise by action of the controller 3-7. In the latter case, a so-called SCF (switched capacitor filter) is used, and an SCF-controlling clock pulse frequency is changed by the controller. FIG. 13 is a block diagram showing an example of a frequency characteristic measuring section as described above. In FIG. 13, reference numeral 3-63 designates the center frequency variable filter (SCF).

Figure 14:
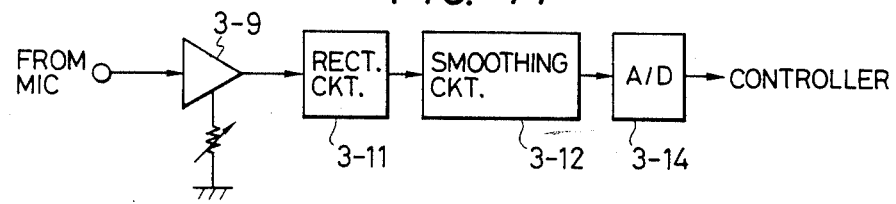

In the above-described embodiment, a pink noise signal is employed as the test signal. However, it may be replaced by a warble tone signal. In the latter case, the BPF may be eliminated from the measuring section, simplifying the block diagram of the system, as shown in FIG. 14.

Figure 15:
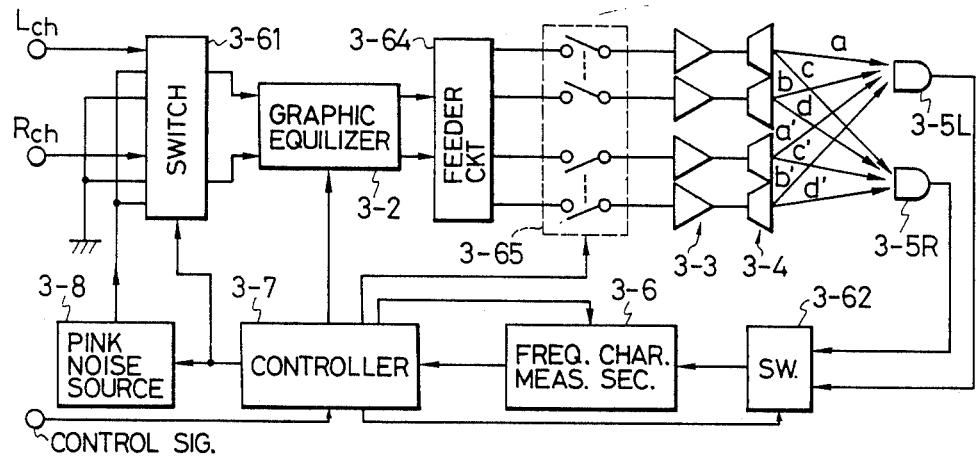

A four-loudspeaker output system may be employed. In this case, in addition to the paths a through d, there are paths a' through d' between the microphones and the loudspeakers, as shown in FIG. 15. In FIG. 15, reference numeral 3-64 designates a feeder circuit which divides each of the right and left channel lines into two systems and adjusts the difference in sound volume level therebetween, and reference numeral 3-65 designates a switch for performing on-off control of the loudspeakers.

First, the first system of the switch 3-65 is turned on, and with respect to the right and left channels of the system and the microphones 3-5R and 3-5L, the same operations as those in the above-described embodiment are carried out to obtain the data for the paths a through d. Next, the switch 3-65 is operated, and with respect to the right and left channels of the second system and the microphones 3-5R and 3-5L, the data for the paths a' through d' is obtained in the same manner. The data values so obtained are added separately according to frequency bands to obtain frequency characteristic data. The subsequent operations are carried out in the same manner as in the above-described embodiment.

Figure 16:
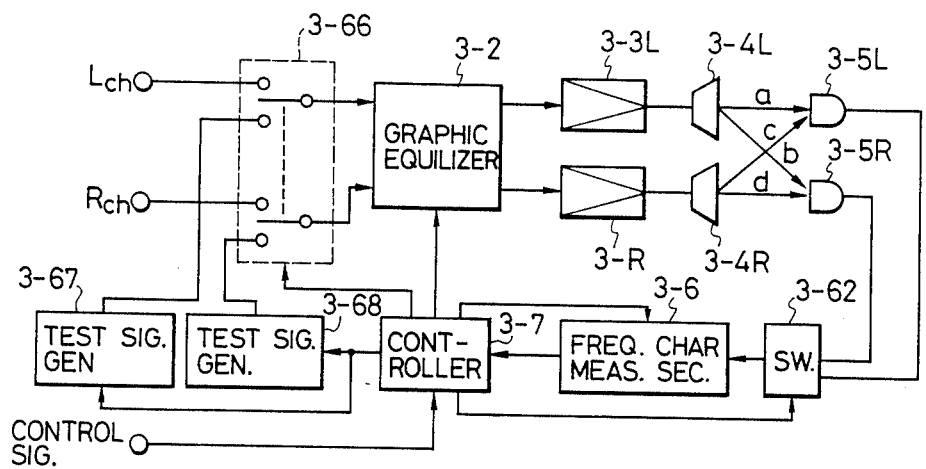

In the above-described embodiment, only one test signal generating source is provided; however, as shown in FIG. 16, two test signal generating sources 3-67 and 3-68 may be provided respectively for the left and right channels. In the latter case, the two test signals may be outputted simultaneously; however, they are not correlated with each other. Assuring that the two test signals were correlated with each other, for instance, they are the same signal, even if the frequency characteristic in the listening space would be flat, the phase is shifted in accordance with the difference in distance along the paths (assuming the power attenuation causes no problem), and therefore sometimes the power of the synthetic signal would not coincide with the actual power value.

In the case where the two test signals are not correlated with each other, the output of each microphone is proportional to sum of the power in the paths, and the two test signals can be outputted simultaneously. The output of the microphone 3-5L is the sum of the data of the paths a and c, and similarly the output of the microphone 3-5R is the sum of the data of the paths b and d. Therefore, first the switch 3-62 is operated to select the microphone 3-5L to obtain the data value $D_{M1}$, and then the microphone 3-5R is selected to obtain the data $D_{M2}$. The sum of these data values, $D_{M1}+D_{M2}$, is the sum of the powers of the paths a through d, as in the above-described embodiment.

As is apparent from the above description, according to the invention, two microphones set at ear positions are used to detect the test signal or signals. With this arrangement, the frequency characteristic measurement can be performed accurately at the listening point, and the sound field correction can be carried out in conformance with the actual auditory perception.

Figure 17:
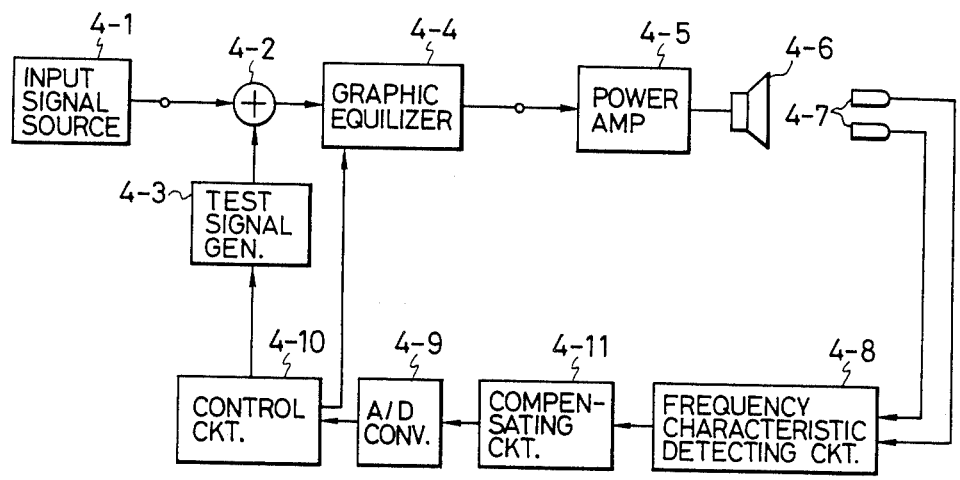
FIG. 17 is a block diagram showing an automatic sound field correcting system of the invention.
Figure 18:
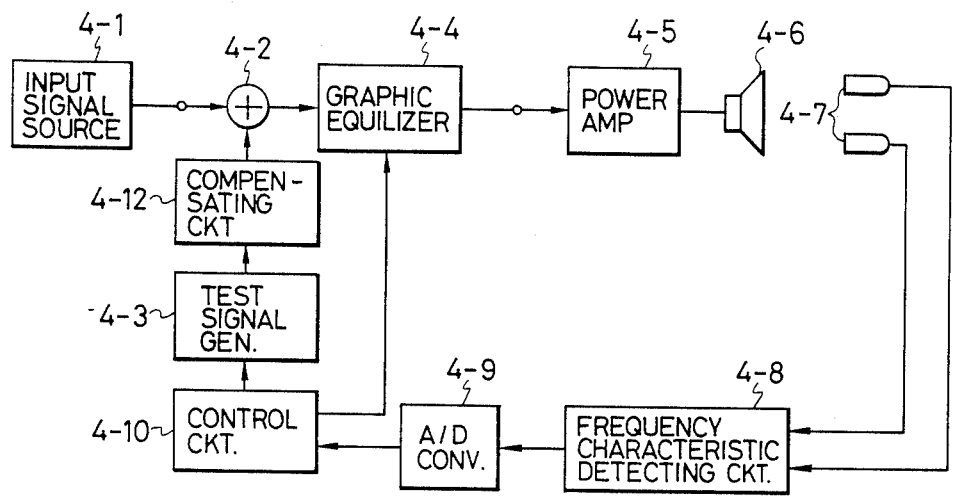
FIG. 18 is a block diagram of another automatic sound field correcting system of the invention.

An embodiment of an automatic sound field correcting system of the invention will be described with reference to FIG. 17. In FIG. 17, components corresponding functionally to those which have been already described with reference to FIG. 5 are therefore designated by the same reference numerals.

Figure 6:
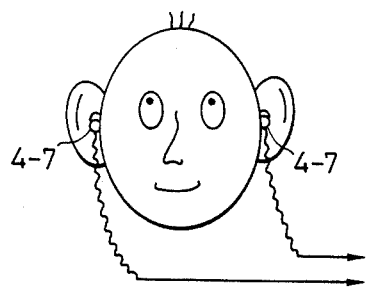
FIG. 6 is an explanatory diagram indicating the arrangements of microphones used in the system of FIG. 17.
Figure 7:
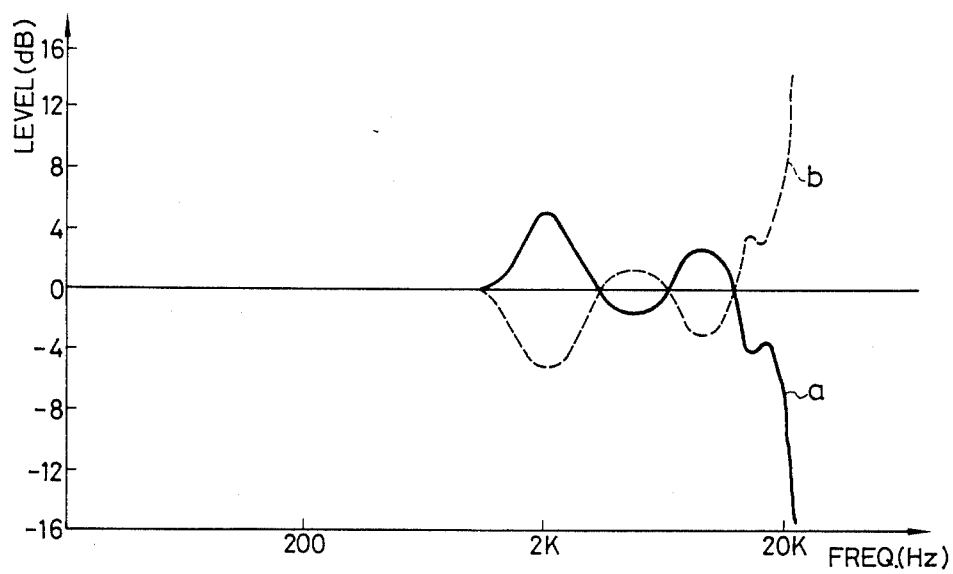
FIG. 7 is a graphical representation indicating a sound field frequency characteristic detected with the microphones shown in FIG. 6, and a sound field frequency characteristic opposite the former.
Figure 8:
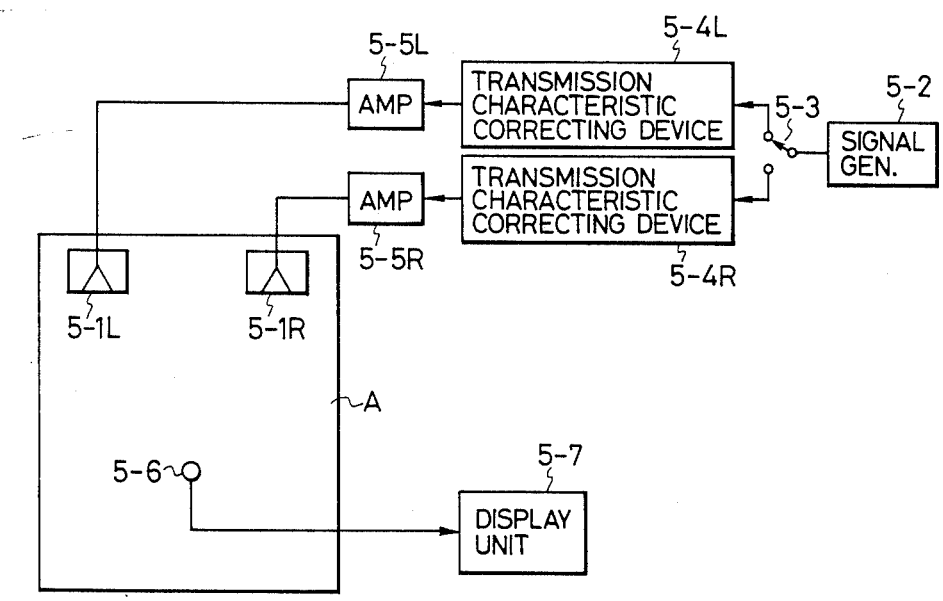
FIG. 8 is a block diagram showing a conventional acoustic characteristic measuring system.

The output terminal of the frequency characteristic detecting circuit 4-8 is connected to a compensating circuit 4-11. The compensating circuit 4-11 is composed of an amplifier or attenuator having a frequency characteristic (as indicted by the broken line b in FIG. 7) opposite to the sound field frequency characteristic obtained from the output signal of the frequency characteristic detecting circuit 4-8 in the ideal listening space. The output signal of the compensating circuit 4-11 is supplied to the A/D converter 4-9. The two microphones 4-7 are set at the ears of the listener as shown in FIG. 6.

Figure 5:
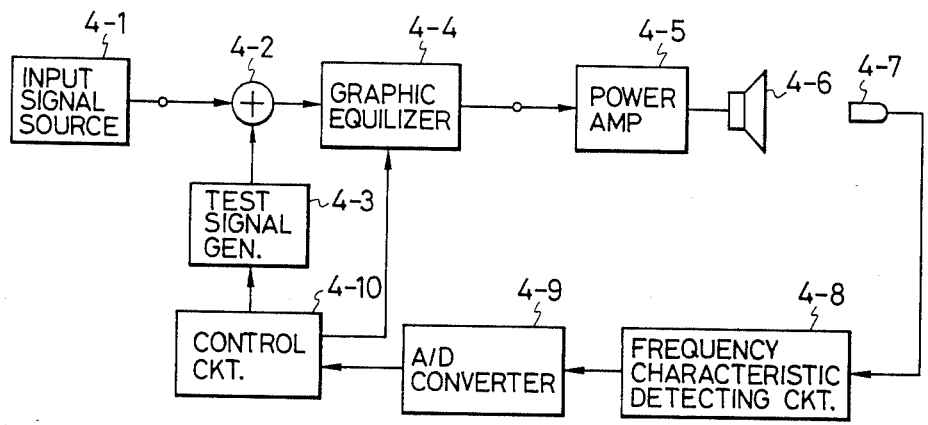
FIG. 5 is a block diagram of a conventional automatic sound field correcting system.

In the automatic sound field correcting system of the invention, the other components are the same as those in the system shown in FIG. 5.

In the system thus constructed, the output level of the frequency characteristic detecting circuit 4-8 is compensated by the compensating circuit 4-11, i.e., it is weighted. Therefore, with the effects of the head, the face, the ears, etc., of the listener included in the output signal of the frequency characteristic detecting circuit 4-8 being eliminated, the output signal of the circuit 4-8 is applied through the A/D converter 4-9 to the control citcuit 4-10. Accordingly, in practice, the control of the gain levels of the adjustment bands of the graphic equalizer 4-4 to make the sound field frequency characteristic flat in audio reproduction need not be carried out, and the characteristic frequency is controlled so that it is made irregular in such a way as to compensate for any unnaturalness in hearing sensatio, i.e., as much as the compensation by the compensating circuit 4-11.

In the case where, in the above-described embodiment of the invention, the frequency characteristic detecting circuit 4-8 is of a type including a plurality of BPFs having different bandpass characteristics which can be selectively used, the output of each BPF should be connected to a compensating device such as an attenuator having an amount of compensation corresponding to its central frequency. In the case where a warble tone is employed as the test signal, in the compensating circuit 4-11, compensation is performed in an amount corresponding to the frequency of the warble tone. In this connection, a plurality of attenuation or amplifiers providing different amounts of compensation may be used in such a manner that the attenuators or amplifiers are selectively operated according to the frequency of the warble tone.

In the above-described embodiment, the compensating circuit 4-4 is connected between the frequency characteristic detecting circuit 4-8 and the A/D converter 4-9. However, the invention is not limited thereto or thereby. That is, the same effects can be obtained by connecting the compensating circuit 4-12 between the test signal generator 4-3 and the adder 4-2.

As is apparent from the above description, in the automatic sound field correcting system according to the invention, a device for compensation for unnaturalness in bearing sensation in the sound field frequency characteristic is inserted in the line through which the test signal is supplied to the electro-acoustic transducer or in the line of processing the output signals of the two microphones. Therefore, by discriminating the sound field frequency characteristic according to the output signals of the two microphones set at the ears of the listener, sound field correction can be achieved under practical conditions, and the audio reproduction can be performed so as to yield a characteristic providing excellent auditory sensation.

Figure 19:
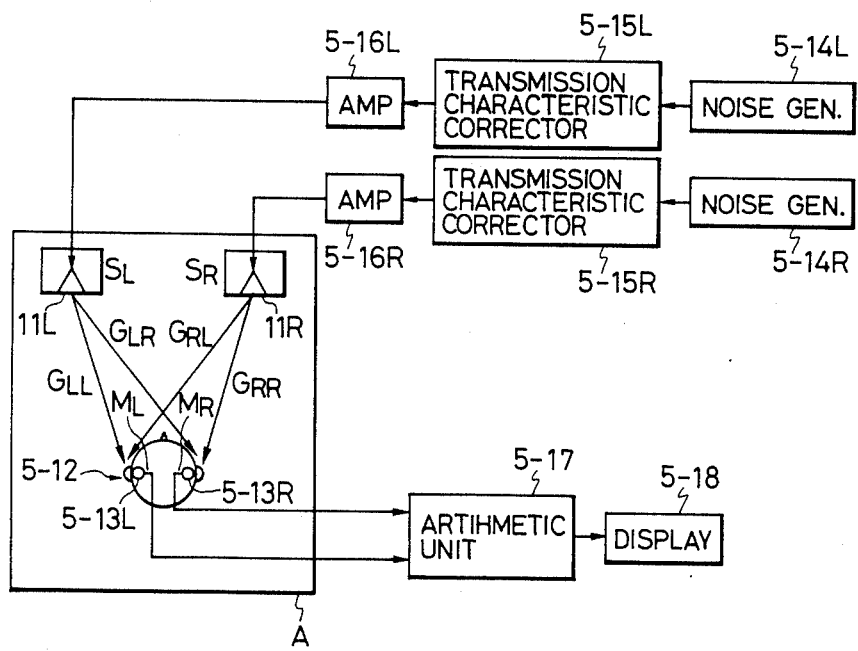
FIGS. 19 through 21 are block diagrams showing respective embodiments of an automatic characteristic measuring system of the invention.

FIG. 19 is a diagram showing another acoustic characteristic measuring system of the invention. As shown in FIG. 19, a pair of loudspeakers 5-11R and 5-11L are arranged at the right and left sides in a room A. Sound reproduced by these loudspeakers forms a sound field in the room.

A dummy mannequin 5-12 (only the head of which is shown) is set at the listenign point where sound from the loudspeakers 5-11R and 5-11L can be listened to. Microphones 5-13R and 5-13L are set at the respective right and left ears of the dummy mannequin 5-12.

The structure of the dummy mannequin 5-12 is similar to that of a real human body, having a body trunk, legs, etc. The surface of the dummy mannequin has a second absorbing characteristic substantially equivalent to the average sound absorbing characteristic of a clothed human body, as shown in FIG. 10 and as discussed above.

Instead of the dummy mannequin, a real human or a dummy head with the microphones 5-13R and 5-13L at the ears may be arranged at the listening point.

Signal generators 5-14R and 5-14L are provided to individually drive the pair of loudspeakers 5-11R and 5-11L, respectively. These signal generators 5-14R and 5-14L produce random or quasi-random noise signals such as pink noise signals or white noise signals which are not correlated with each other. These uncorrelated source signals are supplied through transmission characteristic correcting devices 5-15R and 5-15L and amplifiers 5-16R and 5-16L to the loudspeakers 5-11R and 5-11L, respectively.

Since the source signals applied to the loudspeakers 5-11R and 5-11L are not correlated with each other, power addition of acoustic signals outputted by the loudspeakers 5-11R and 5-11L can be obtained in the sound field. Accordingly, the outputs of the microphones 5-13R and 5-13L are the power additions of the acoustic signals outputted by the loudspeakers 5-11R and 5-11L, respectively. The outputs of the microphones 5-13R and 5-13L are applied to an arithmetic unit 5-17, where the addition (power addition) of these outputs is calculated. That is, the sound field is assumed as being described by a single transfer function. The calculation result of the arithmetic unit 5-17 is displayed on a display unit 5-18.

The operation of the acoustic characteristic measuring device will be described.

First, the sound reception characteristic of the human ear and that of a nondirectional microphone will be compared with each other using geometrical acoustic expressions. If the sound reception characteristic of the human ear is represented as an impulse response $R_D$ on the ear drum membrane and an impulse $P_n(t)$ is applied to one ear at the incident angle $\theta\phi_n$ (where n is the number of the sound source, $\theta$ is the horizontal angle, and $\phi$ is the vertical angle), then the following equation is obtained as the sum in all direction in the surrounding 4# space:

$$R_D = P_i(t) \cdot D_M(\theta\phi_i) \cdot G,$$

where i indicates the i-th sound source, $D_M$ is tne external transfer function of the human ear with an incident angle $\theta\phi_i$ with respect to a sound source S, and G is the internal transfer function corresponding to the acoustic impedance inside the ear.

For instance inside a vehicle, the sound source, the wall surfaces, the seats and the listening point are close to one another, and therefore the free path of a sound wave will vary strongly depending on the position of a person seated in the vehicle room. This variation will be defined as "a degree of acoustic disturbande $D_C(\theta\phi_i)$. If the ear's directional pattern is represented by a head transfer function $D_R(\theta\phi_i)$, then:

$$D_M(\theta\phi_i) = D_R(\theta\phi_i) \cdot D_D(\theta\phi_i)$$

An impulse response including this can be represented by the following expression:

$$R_D = \Sigma P_i(t) \cdot D_R(\theta\phi_i) \cdot D_D(\theta\phi_i) \cdot G \quad (1)$$

On the other hand, in the case of a nondirectional microphone, the degree of acoustic disturbance is so small that it can be disregarded. Therefore, according to the same technical concept, an impulse response $R_M$ in the vibrating system is:

$$R_M = \Sigma P_i(t) \quad (2)$$

The difference between equations (1) and (2) represents the difference in characteristic between these sound reception systems. Of the parameters in expression (1), the internal transfer function G is substantially constant, irrespective of the incident direction of sound, and therefore the inverse function can be normalized by the use of a one-dimensional electrical system. However, the directional pattern $D_R$ and the degree of acoustic disturbance $D_D$, being based on a three-dimensional spatial sound reception characteristic, cannot be synthesized with a one-dimensional process in an electrical system. That is, with respect to the difference in characteristic between the two sound reception systems, it is difficult to perform the necessary conversion of the data.

As is apparent from the above description, it is essential that the microphone, which is a fundamental element in a sound field measuring system, have as sound reception characteristics a directional pattern and a degree of acoustic disturbance which are closely equivalent to those of a human body. Accordingly, it is effective to use the microphones 5-13R and 5-13L set at the ears of the dummy mannequin 5-12 having a sound absorbing characteristic similar to that of a clothed human body, as described above.

In the above-described sound reception system, the right and left ears have some degree of correlation in a general sound field (with exception of headphone sound reception). Therefore, it is difficult to control independently the transmission characteristic for the right and left ears, which is an index of correction of the sound field. Therefore, under the assumption that the characteristic obtained by addition of the transmission characteristic dependent on the right and left ears is the transmission characteristic of the sound reception system, average of the outputs of the microphones 5-13R and 5-13L is obtained by operation of the arithmetic unit 5-17, and the characteristic obtained thereby is utilized for the sound field evaluation.

In the arithmetic unit 5-17, in order to utilize the signals at the ears as average levels independent of each other, the power spectrum from which vector (including phase) components are eliminated (the absolute values of sound pressures at various frequencies) is obtained and is added between the ears. Furthermore, the added transmission characteristics are each converted into ⅓ octave band average levels, which are evaluated as transmission characteristics. This is due to the following reason: Since the ⅓ octave band corresponds substantially to the human critical bandwidth, analytic data obtained by using the ⅓ octave band agree well with the hearing perception, and the variation of the narrow band spectrum in the band scarcely affects the hearing perception.

In the case where the measurement is carried out with the loudspeakers of the different channels driven simultaneously, signals such as random noise signals which have no correlation between the channels are employed as source signals for the loudspeakers 5-11R and 5-11L because, in order to satisfy the above-described measurement condition (power addition), it is necessary that, on the sound source side, the measuring signals are not correlated in generation probability with each other between the channels. This prevents the mutual interference of the channel signals in the vicinity of the listening point and minimizes fluctuation of the transmission characteristic due to deflection of measuring points.

In the above-described power addition process, the plural (two channels of stereo) sound sources and the two sound reception systems (the ears) have independent transfer functions, and the sum of these transfer functions is employed as a transmission function for the sound reception systems and the sound sources. In order to handle these transfer functions independently of one another, it is essential that the signals from the sound sources are not correlated between channels. This will become more apparent from the following description:

If, in FIG. 19, the outputs of the two sound sources (the loudspeakers 5-11R and 5-11L) are represented by $S_R$ and $R_L$, the outputs of the two sound reception systems (the microphones 5-13R and 5-13L) by $M_M$ and $M_L$, and the sound reception systems by $G_{LR}$, $G_{LL}$, $G_{RR}$ and $G_{RL}$, then the outputs $M_R$ and $M_L$ of the microphones in the signal reception systems are:

$$M_L = \sqrt{(S_L \cdot G_{LL})^2 + (S_R \cdot G_{RL})^2}$$

$$M_R = \sqrt{(S_R \cdot G_{RR})^2 + (S_L \cdot G_{LR})^2}$$

For the transmission characteristic with $M = M_R + M_L$, the power addition value is $M^2$.

$$M^2 = (S_R \cdot G_{RR})^2 + (S_L \cdot G_{LR})^2 + (S_L \cdot G_{LL})^2 + (S_R \cdot G_{RL})^2 +$$

$$2[\sqrt{(S_R \cdot G_{RR})^2 + (S_L \cdot G_{LR})^2} \cdot \sqrt{(S_L \cdot G_{LL})^2 + (S_R \cdot G_{RL})^2}]$$

In the above equation, with respect to the second term;

$$2[(S_R \cdot G_{RR})^2(S_L \cdot G_{LL})^2 + (S_R \cdot G_{RR})^2(S_R \cdot G_{RL})^2 +$$

$$(S_L \cdot G_{LR})^2(S_L \cdot G_{LL})^2 + (S_L \cdot G_{LR})^2 + (S_R \cdot G_{RL})^2]^{\frac{1}{2}} =$$

$$2[S_R^2(G_{RR} \cdot G_{RL}) + S_L^2(G_{LR} \cdot G_{LL})].$$

Therefore, $$(S_R \cdot G_{RR})^2(S_R \cdot G_{RL})^2 \overset{3}{\underset{2}{=}} 0$$

$$(S_L \cdot G_{LR})^2(S_L \cdot G_{LL})^2 = 0,$$

the product of which are not in correlation between the right and left channels.

$$M^2 = S_R^2(G_{RR} + G_{RL})^2 + S_L^2(G_{LL} + G_{LR})^2$$

$$= [S_R(G_{RR} + G_{RL}) + S_L(G_{LL} + G_{LR})]^2 -$$

$$S_R S_L(G_{RR} + G_{RL}) \cdot (G_{LL} + G_{LR})$$

$$= |S_R \cdot G_{RR} + S_R \cdot G_{RL} + S_L \cdot G_{LL} + S_L \cdot G_{LR}|$$

Therefore, $$(G_{RR} + G_{RL}) \cdot (G_{LL} + G_{LR}) = 0$$

In the above-described embodiment, in the case where the measurement is carried out with plural sound sources driven simultaneously, the source signals are not correlated between the channels. However, if it is possible to drive the sound sources in a time division manner, then it is not necessary that the source signals are uncorrelated.

Figure 20:
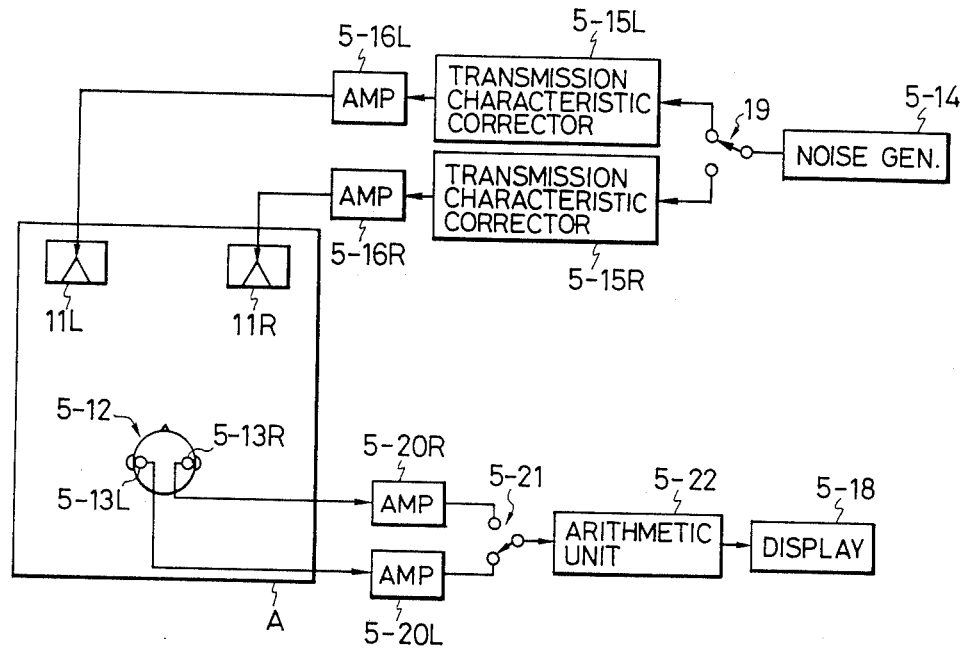

FIG. 20 is a block diagram showing another embodiment of the invention. In FIG. 20, elements corresponding to those which have been already described with reference to FIG. 19 are therefore designated by the same reference numerals or characters.

In the embodiment of FIG. 20, a signal generator 5-14 is provided as a signal source for the loudspeakers 5-11R and 5-11L. A source signal produced by the signal generator 5-14 is applied through a changeover switch 5-19 to the loudspeaker 5-11R or 5-11L. The outputs of the microphones 5-13R and 5-13L are applied respectively through microphone amplifiers 5-20R and 5-20L to a changeover switch 5-21 used to selectively apply the outputs to a memory arithmetic unit 5-22. When, with respect to the right and left loudspeakers 5-11R and 5-11L and the microphones 5-13R and 5-13L, the measurements have been accomplished, the mean square value of the outputs of the microphones 5-13R and 5-13L is calculated by the memory and arithmetic unit 5-22. This is equivalent to obtaining the average of the power addition of the loudspeakers 5-11R and 5-11L as a single transfer function.

Figure 21:
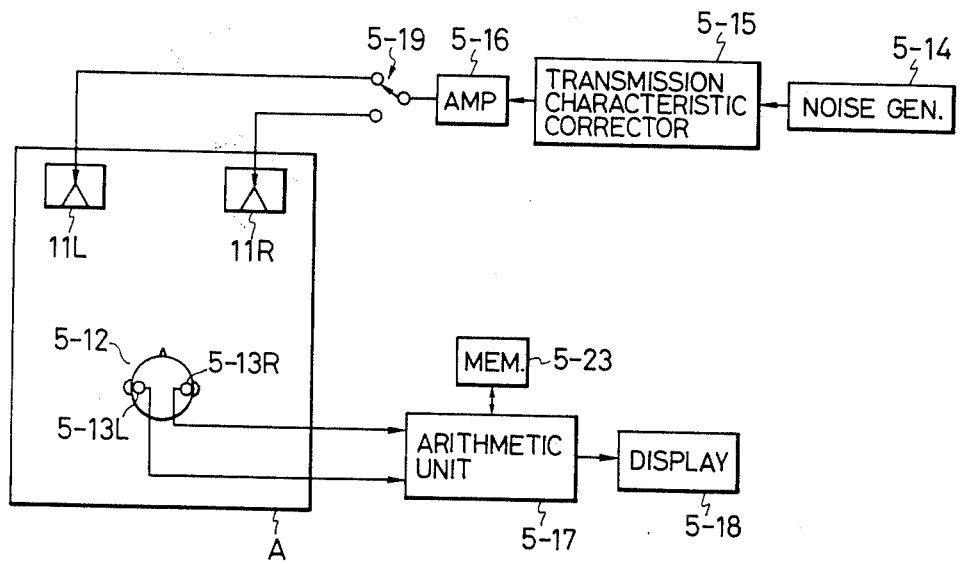

FIG. 21 is a block diagram showing still another embodiment of the invention. In FIG. 21, those components which have been already described with reference to Fig. 19 are therefore designated by the same reference numerals or characters. In the FIG. 21 embodiment, a signal having a significant amplitude-frequency characteristic, such as a warbel tone, pure swept tone or impulse, is employed as a source signal for the loudspeakers 5-11R and 5-11L. The acoustic characteristic is measured by driving the loudspeakers 5-11R and 5-11L in a time division manner.

More specifically, a signal such as an impulse signal produced by the signal generator 5-14 is applied to the transfer function correcting device 5-15 where the transfer function is corrected. The output of the transfer function correcting device is applied thorugh the amplifier 5-16 and the changeover switch 5-19 to the left loudspeaker 5-11L. Sound reproduced by the loudspeaker 5-11L, while being affected by the sound field, propagates to the microphones 5-13R and 5-13L. The outputs of these microphones 5-13R and 5-13L are subjected to addition in the arithmetic unit 5-17, the output of which is stored in a memory device 5-23. Next, the changeover switch 5-19 is operated to select the right channel. As a result, as in the above-described case, the loudspeaker 5-11R is driven the outpus of the microphones 5-13R and 5-13L are added, and the result of addition is stored in the memory device 5-13.

As is apparent from the above description, the source signals are utilized in a time division manner to drive the loudspeakers 5-11R and 5-11L, and therefore, as in the above-described embodiments, the source signals applied to the loudspeakers are not correlated with each other between channels. The two signals stored in the memory device 5-23 are subjected to addition in the arithmetic unit 5-17, and the result of addition is displayed on the display unit 5-18.

As is clear from the description above, according to the invention, the sound field characteristic can be treated as a single (synthetic) transfer function ($M^2$) by obtaining the power addition or the average of power addition of the outputs of the microphones 5-13R and 5-13L set at the ears of the dummy mannequin, the structure of which is similar to that of a human body. Sound field correction is performed with respect to the aforementioned single transfer function utilizing the transfer function correcting device 5-15, or 5-15R and 5-15L inserted in the electrical circuit or circuits in the reproduction system so that it is satisfactorily in agreement with the actual hearing perception.

In the above-described embodiments, a two-channel stereo acoustic device is employed. However, in a four-loudspeaker reproduction device with two pairs of loudspeakers installed respectively at the front region and at the rear region of a sound field, the measurement may be achieved by obtaining the power addition of the right and left channels of each of the front and rear loudspeakers or by adding in-phase signals between the front and rear loudspeakers of each of the right and left channels. In this case, it is evident that, when the reproduction of a real source is taken into consideration, the same effect can be obtained.

In the above-described embodiment, the sum of the outputs of the microphones on the ears is obtained by calculation. However, it goes without saying that the sum of the outputs can be obtained by analog processing, or it may be obtained according to a method in which the outputs are converted into digital data and the digital data subjected to numerical calculation. Furthermore, in the case application is made to an automatic graphic equalizer, the sum can be readily obtained by feeding the outputs back to the transfer function correcting devices 5-15, or 5-15R and 5-15L through a microcomputer or the like.

As is apparent from the above description, with the acoustic characteristic measuring system according to the invention, the acoustic characteristic is measured according to the outputs of the microphones set on the ears of the human body, the dummy mannequin or the dummy head. Therefore, the sound field can be accurately evaluated in agreement with the actual hearing perception.

What is claimed is:

1. An automatic acoustic graphic equalizer comprising: means for applying a test signal to first and second channel audio signal lines; graphic equalizer means provided in said audio signal lines, said grpahic equalizer means having an adjustable frequency characteristic; first and second loudspeakers for radiating sound in response to channel outputs of said grpahic equalizer means in apredetermined sound field; a microphone unit for detecting sound in said sound field; and control means for controlling said frequency characteristic of said graphic equalizer according to a level of a detection signal provided by said microphone unit, the improvement wherein:

said microphone unit comprises first and second microphones set at ear positions of a listener in said predetermined sound field;

said applying means comprises means for applying said test signal selectively to said first and second channel audio signal lines; and said control means comprises characteristic determining means for detecting a frequency characteristic of an output of each microphone, and microphone output selecting means for applying outputs of said first and second microphones selectively to said characteristic detecting means, said characteristic detecting means comprising: means for detecting and adding, when said test signal is applied to said first channel audio signal line, outputs of said first and second microphones to provide a detection addition output level, and when said test signal is applied to said second channel audio signal line, outputs of said first and second microphones to provide a detection addition output level, said graphic equalizer being controlled according to said detectio addition output levels.

2. The automatic graphic equalizer as claimed in claim 1, wherein:

said control means comprises means for dividing an output of said microphone output selecting means into separate outputs in a plurality of frequency bands, and said detecting and adding means comprises means for performing said detecting and adding for subjecting all outputs of said dividing means to addition with respect to outputs of said two microphones in like frequency bands.

3. The automatic graphic equalizer as claimed in either of claims 1 or 2, wherein said test signal is one of a white noise signal, a pink noise signal and a warble tone signal.

* * * * *